Figure 1:
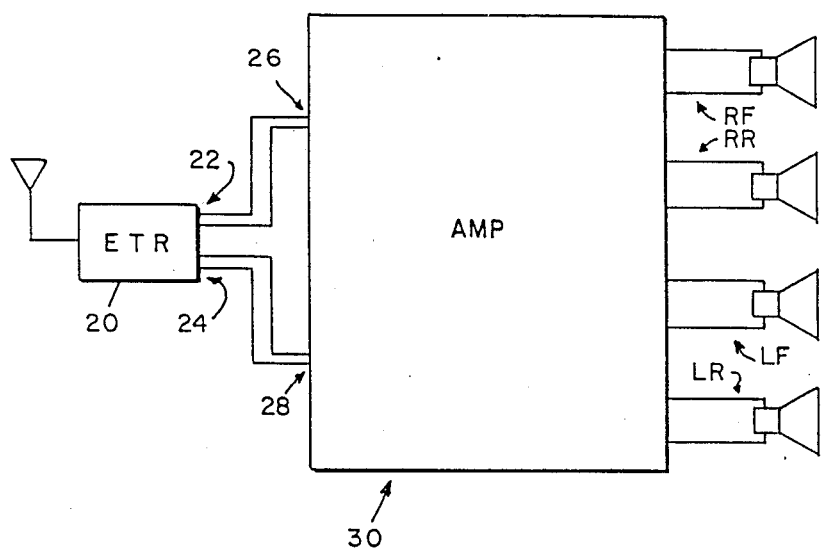

United States Patent [19]
Field et al.

[11] Patent Number: 4,759,065
[45] Date of Patent: Jul. 19, 1988

[54] AUTOMOTIVE SOUND SYSTEM
[75] Inventors: Daniel J. Field, Bloomington, Ind.; Richard C. Field, Monroe, Wis.
[73] Assignee: Harman International Industries, Incorporated, Northridge, Calif.
[21] Appl. No.: 909,634
[22] Filed: Sep. 22, 1986
[51] Int. Cl.4 ............................................. H03G 5/00
[52] U.S. Cl. ..................................... 381/98; 381/86; 333/28 T
[58] Field of Search ................... 381/103, 106, 98, 86; 333/28 R, 28 T

[56] References Cited

U.S. PATENT DOCUMENTS

| | | |
|---|---|---|
| 2,045,300 | 6/1936 | Koch . |
| 2,167,011 | 7/1939 | Tellegen . |
| 2,173,426 | 9/1939 | Scott . |
| 2,190,318 | 2/1940 | Kellogg . |
| 2,606,969 | 8/1952 | Scott . |
| 2,606,970 | 8/1952 | Scott . |
| 2,606,971 | 8/1952 | Scott . |
| 2,606,973 | 8/1952 | Scott . |
| 2,759,049 | 8/1956 | Scott . |
| 2,948,778 | 8/1960 | Clements . |
| 3,134,059 | 10/1938 | Schade . |
| 3,281,723 | 10/1966 | Mercer . |
| 3,290,442 | 12/1966 | Suganuma . |
| 3,334,184 | 8/1967 | DeKoning . |
| 3,449,518 | 6/1969 | Erath . |
| 3,452,282 | 6/1969 | Beres . |
| 3,497,622 | 2/1970 | Markin et al. . |
| 3,530,244 | 9/1970 | Reiffin . |
| 3,571,529 | 3/1971 | Gharib et al. . |
| 3,665,345 | 5/1972 | Dolby . |
| 3,678,416 | 7/1972 | Burwen . |
| 3,753,159 | 8/1973 | Burwen . |
| 3,798,374 | 3/1974 | Meyers . |
| 3,803,359 | 4/1974 | Corderman . |
| 3,803,423 | 4/1974 | Libby . |
| 3,821,473 | 6/1974 | Mullins . |
| 3,889,060 | 6/1975 | Goto et al. . |
| 3,890,465 | 6/1975 | Kaizu . |
| 3,911,371 | 10/1975 | Nakamura et al. . |
| 3,921,077 | 11/1975 | Suzuki . |
| 3,925,708 | 12/1975 | Picciochi . |
| 3,934,085 | 1/1976 | Munson et al. . |
| 3,937,887 | 2/1976 | Miller . |
| 3,939,428 | 2/1976 | Shimizu et al. . |
| 3,940,709 | 2/1976 | Heaslett ............................ 381/103 |
| 3,959,735 | 5/1976 | GrosJean . |
| 3,967,219 | 6/1976 | Dolby . |
| 3,991,370 | 11/1976 | Pate . |
| 3,997,724 | 12/1976 | Seebinger . |
| 4,061,874 | 12/1977 | Fricke et al. . |
| 4,113,983 | 9/1978 | Steel . |
| 4,127,743 | 11/1978 | Ozawa et al. . |
| 4,163,119 | 7/1979 | Baba et al. . |
| 4,225,822 | 9/1980 | Kariatsumari . |
| 4,247,955 | 1/1981 | Weidemann . |
| 4,296,278 | 10/1981 | Cullison et al. . |
| 4,301,330 | 11/1981 | Trump . |
| 4,330,686 | 5/1982 | Roe . |
| 4,342,023 | 7/1982 | Tsunoda et al. . |
| 4,408,095 | 10/1983 | Ariga et al. . |
| 4,466,118 | 8/1984 | Dressler . |
| 4,466,119 | 9/1984 | Peters et al. . |
| 4,484,345 | 11/1984 | Stearns ................................ 381/98 |
| 4,490,683 | 12/1984 | Rhee . |
| 4,490,691 | 12/1984 | Dolby ................................ 381/106 |
| 4,525,856 | 6/1985 | Admiraal et al. . |
| 4,612,665 | 9/1986 | Inami et al. ......................... 381/98 |
| 4,661,982 | 4/1987 | Kitazato et al. .................... 381/98 |

FOREIGN PATENT DOCUMENTS

| | | |
|---|---|---|
| 1299328 | 7/1969 | Fed. Rep. of Germany . |
| 56-15186 | 8/1982 | Japan . |
| 57227754 | 7/1984 | Japan . |
| 1367002 | 8/1974 | United Kingdom . |
| 1520156 | 8/1978 | United Kingdom . |

Primary Examiner—Forester W. Isen
Attorney, Agent, or Firm—Barnes & Thornburg

[57] ABSTRACT

A sound system comprises four channels, each having a low level input for coupling to a source of program material, multiple, independently selectable gyrators providing equalization poles, and an input stage for independently and selectively coupling one or more of the gyrators to the low level input. Each channel further includes an amplifier, a buffer for coupling the selected one or more of the multiple gyrators to the amplifier, and a transducer coupled to the amplifier. A filter is coupled between the buffer and the amplifier. The filter has a variable lower corner frequency and a control input terminal. The sound system further comprises a low-pass filter circuit coupled between the amplifier and the control input terminal of the variable corner frequency filter for generating a feedback signal.

9 Claims, 3 Drawing Sheets

AUTOMOTIVE SOUND SYSTEM

This invention relates to automotive sound systems, and particularly to a system which employs psychoacoustic contouring of the program material signal, based upon the hearing characteristics of the human ear.

It has long been known that the apparent sensitivity of the human ear is dependent upon how loud program material is, and the frequency of that program material. For example, it is known that, at low program material loudness levels, low frequency program material is much lower in apparent volume than a higher frequency program material. As loudness level increases, the apparent difference in loudness between equal amplitude low frequency program material signals and high frequency program material signals diminishes. This effect is described in various reference works under the heading "equal loudness contours." Equalization loosely based upon equal loudness contours has been utilized in the past.

Invariably, in the design of an audio system for an automotive vehicle, certain compromises are made. The acoustic environment of an automobile is a unique environment. It is small, fully enclosed and relatively noisy. There are surfaces in the vehicle that are highly absorptive, such as car seats, padded dashboards and headliners. There are surfaces in a car that are highly reflective, such as window glass. There are size and placement constraints on the choice of loudspeakers to play within the environment of an automobile.

Certain design advantages, however, are available in the automotive sound system environment. For example, the designer knows generally where the occupants of the car are going to be seated. Therefore, specific equalization of a system at the intended location of the listener's ear can be achieved. The relatively small enclosed space of an automobile interior can be used to good advantage in terms of bandwidth with proper system design.

One demand for a high-quality automotive sound system is that the bandwidth of the system be as wide as possible. Much musical information otherwise can be masked or lost in a system that is "midrange-heavy," has acoustic dips or "notches", or does not reproduce high or low frequencies with maximum fidelity.

To deal with the sound absorption characteristics of an automobile interior, it is essential when designing an automotive sound system to address the true sound power generated by the speakers mounted in the automobile. Since speakers generally become more directional as frequency of program material increases, the sound power radiated as frequency increases is radiated in a narrower and narrower beam. The contributions of off-axis sound pressure response become more and more critical as speaker mounting location considerations restrict the ideal placement of speakers.

According to the invention, a sound system comprises a channel having a low level input for coupling to a source of program material, multiple, independently selectable notch filters, means for independently and selectively coupling one or more of the multiple notch filters to the low level input, an amplifier, means for coupling the selected one or more of the multiple notch filters to the amplifier, a transducer, and means for coupling the transducer to the amplifier.

According to an illustrative embodiment, the means for coupling one or more of the notch filters to the low level input comprises an input stage, and the means for coupling the selected one or more of the multiple notch filters to the amplifier comprises a second stage.

Further according to an illustrative embodiment, the means for coupling the selected one or more of the multiple notch filters to the amplifier comprises a filter having a variable lower corner frequency and a control input terminal. The sound system further comprises a low-pass filter circuit for generating a feedback signal, means for coupling the low-pass filter circuit to the amplifier, and means for coupling the low-pass filter circuit to the control input terminal of the variable corner frequency filter.

Additionally according to an illustrative embodiment, the sound system includes four such channels divided into two pairs, and the low-pass filter circuits in one pair of such channels have higher corner frequencies than the low-pass filter circuits in the other pair of such channels.

Illustratively, the sound system is an automotive sound system and the two pairs of channels comprise a pair of front channels and a pair of rear channels and the low-pass filter circuits in the rear channels have relatively lower corner frequencies than the low-pass filter circuits in the front channels.

This provides a preferred technique for equalizing the sound system to a listening area, such as the interior of an automotive vehicle. This permits "tailoring" of the equalization characteristics of the means which couple the program material source to the discriminating means to the interior of a particular automotive vehicle.

The system of the present invention uses woofers for extended low frequency performance, midrange speakers for smooth, low distortion midband output, and tweeters for extended high frequency performance. The system comprises four three-way speaker systems, one in each corner of the automotive vehicle interior. The radiating area of the woofers is adequate to provide reduced woofer excursion necessary for a particular sound pressure level (SPL). Thus, distortion is reduced. The use of midrange speakers permits the power response characteristic of the sound system to remain much flatter to a higher frequency than prior art systems. The midrange speakers have smaller diaphragms with wider directional patterns in the mid-band frequencies. Positioning of the speakers of the system thus becomes less critical for proper tonal balance than was the case with prior art systems. The large piston area of the woofers of the described system at low frequency produces high output with low coil excursion. The reduced coil excursion leads to lower distortion at the same output levels as prior art higher-excursion transducers. The excursion of the midrange speakers of the present described system is also very low, because the midrange speakers are crossed over at 400 Hz, where cone excursion is somewhat lower. The woofers and midrange speakers of the described sound system are separate from each other (discrete). Therefore, distortion due to modulation by a low frequency piston motion is reduced in the described system, as compared to a single, full-range driver.

The sound system described in this application makes considerable use of psychoacoustic effects. The performance of this system is such that full frequency range reproduction is provided without having to adjust the system playback level to the level of the original performance. Equalizing to the contours utilized in the described system provides an added benefit. Low frequency sounds in an automotive vehicle environment are usually masked by road and engine noise. In order to hear low frequency sounds in prior art automotive sound systems, especially at low listening levels, considerable bass boost was needed. With the system of the present invention, the correct amount of bass boost is added so that the frequency spectrum is properly balanced at all volume levels. The system automatically makes the needed bass frequency adjustment, depending upon the voltage at the loudspeaker voice coils, so that bass performance is maximized.

An additional benefit of this contouring action is that it is virtually impossible to overdrive the system's speakers. The same circuitry that maximizes the bass performance at low program material amplitudes minimizes the likelihood of exceeding the system's power handling capability at high program material amplitudes. This provides a means of achieving essentially full system output capability at all levels by employing circuitry which amounts to an analog excursion control computer. The analog excursion control computer permits the highest possible output down to the lowest possible frequency regardless of the program material playback level. This circuitry is always active in the system and provides the widest possible bandwidth and proper low frequency tonal balance for every listening level. Moreover, distortion due to excessive driver excursion is eliminated by this circuitry.

It is envisioned that the automotive sound system here described will make use of all available package space to maximize low frequency performance capability. For example, it is envisioned that the rear speakers for both channels (RR and LR) will be mounted on the automobile package tray or behind the rear seat of the automobile so that they work into the trunk volume. Illustratively, trunk volume might be 60 to 300 liters. This is much larger than the customary prior art mounting in which the rear seat speakers work into an enclosure having a volume on the order of 3 liters. This eliminates the need for the rear seat speakers, particularly the woofers, to have additional electrical amplification to overcome any rolloff deficiencies created by a small enclosure. The essentially infinite baffle provided by the trunk volume results in substantial low frequency output, permitting excursion in the piston range at frequencies below 50 Hz.

The circuitry of the present invention provides substantially constant excursion in the 20 Hz through 50 Hz range. In this frequency range, the passenger compartment becomes pressurized at a uniform pressure, based on equal piston displacement, such that the response measures flat through this frequency range. This phenomenon would not occur in free space, because radiation resistance in free space decreases with decreasing frequency, and a 12 dB per octave drop with increasing frequency would be observed. However, in an essentially sealed space, such as the automotive vehicle interior, the piston motion creates a uniform pressure differential between the vehicle interior listening space and the outside. With open windows, doors and sunroofs, the radiation loads are generally favorable, such that the system will still measure substantially flat, even though no sealed space exists. A vented system, such as some of the prior art high fidelity sound systems proposed for automotive vehicles, cannot achieve this same effect because the venting provides a "leak" for the low frequency output of the transducers. In such prior art systems, transducer movement at these frequencies in the piston range is cancelled by the back wave arriving through the port or vent out of phase with the front wave. The vent, which is used to achieve 3 dB greater output at 50 Hz, is employed at the sacrifice of a 24 dB per octave rolloff below 50 Hz.

The distribution of sound throughout the automotive vehicle interior listening space is as important as smooth frequency response and wide bandwidth to the overall sound quality within the listening space. An example of a sound system constructed according to the present invention employs four midrange speakers of equal bandwidth and tonal qualities, one in each corner of the vehicle interior. The result is a tonal characteristic that is even and balanced from right to left and from front to rear of the listening space. The desired quality of tonal balance is not lost when the system if faded from front to rear. To enhance the low frequency performance of the system, circular $5\frac{1}{4}''$ (13.34 cm.) front channel woofers are augmented below 100 Hz by the rear eliptical $6''\times 9''$ (15.24 cm.$\times$22.86 cm.) woofers when the system is faded forward. Additionally, in any automotive vehicle in which the installation of the sound system of the present invention is restricted to midrange speakers in the front channels, because of size restraints, for example, the benefit of augmented low frequency information from the rear channels is available with the system of the present invention. Since the system is operating in the pressure mode, as described above, the directionality of the low frequency information is undetectable. Frequency selective fading, in which the higher frequencies are faded front-to-rear or rear-to-front by the fade control, but the low frequencies are distributed evenly throughout the listening space, enhances the tonal balance of the system.

The circuitry of the present invention provides a regulated DC-to-DC converter circuit that converts the vehicle's nominal $+14$ VDC to $+28$ VDC, $+15$ VDC, $-15$ VDC and $-28$ VDC for the power amplifiers and analog bass computers. The converter-type amplifier is used because of its excellent regulating characteristics and its very high voltage swing to permit sufficient drive voltage into a 4 ohm speaker network. The dynamic range requirement of the sound system of the present invention demands a relatively strong and stable power supply, permitting peak currents of over 30 amperes. The supply of the present invention, which is a switching power supply, employs a 50 KHz push-pull oscillator and a shielded 1:2 voltage transformer.

The input stage of the circuitry of the sound system of this invention uses a differential input for maximum rejection of radiated noise from other vehicle circuits such as the alternator, ignition and other electrical devices within the vehicle. Isolated input, output and chassis grounds afford added noise immunity. The circuit includes integral short circuit protection, as well as low voltage and thermal shutdown. A completely buffered equalization circuit provides versatile parametric equalization for each of the four audio channels. The equalization circuits are custom-adjusted for the particular vehicle in which the sound system is being installed.

The bass contour control of the present invention is, in effect, an analog excursion control computer which senses the voltage at the speaker voice coil and controls that voltage relative to sound pressure in the vehicle passenger compartment according to a preprogrammed set of instructions. The frequency response is balanced to approximate the equal loudness contours. The level corresponding to approximately 100 dB measures flat, while the level at 60 dB has 20 to 25 dB relative bass boost. Separate bass contour control circuits, or analog excursion control computers, are provided for the front and rear channels. The front and rear circuits have different circuit constants to match the characteristics of the front or rear speakers, and their respective environments. These bass contour control circuits are adjustable, and can be fine tuned to accommodate different speakers in each location.

The power amplifier for each channel is designed to operate into a 4 ohm speaker load.

Each rear channel's speaker complement includes a 6"×9" (15.24 cm.×22.86 cm.) woofer, two 3½" (8.89 cm.) midrange speakers and two ½" (1.27 cm.) dome tweeters. Each front channel's speaker complement includes a 5¼" (13.34 cm.) woofer, two 3½" (8.89 cm.) midrange speakers and two ½" (1.27 cm.) dome tweeters. The rear woofers have 16 oz. (454 gram) barium ferrite magnets. All woofers have Symmetric Field Geometry motor configurations. 1½" (3.81 cm.) voice coils provide long linear excursions for the rear woofers. The woofer voice coils are variable wound voice coils wound on aluminum coil forms. The woofer cones are polypropylene. The midrange speaker cones are of polyvinyl laminate construction. The tweeter dome diaphrams are formed from high temperature polycarbonate material. The midrange and tweeter assemblies are angled to permit an optimized ratio of direct and reflected sound. The same midrange and tweeter assemblies can be used in all four channels.

Figure 2A:
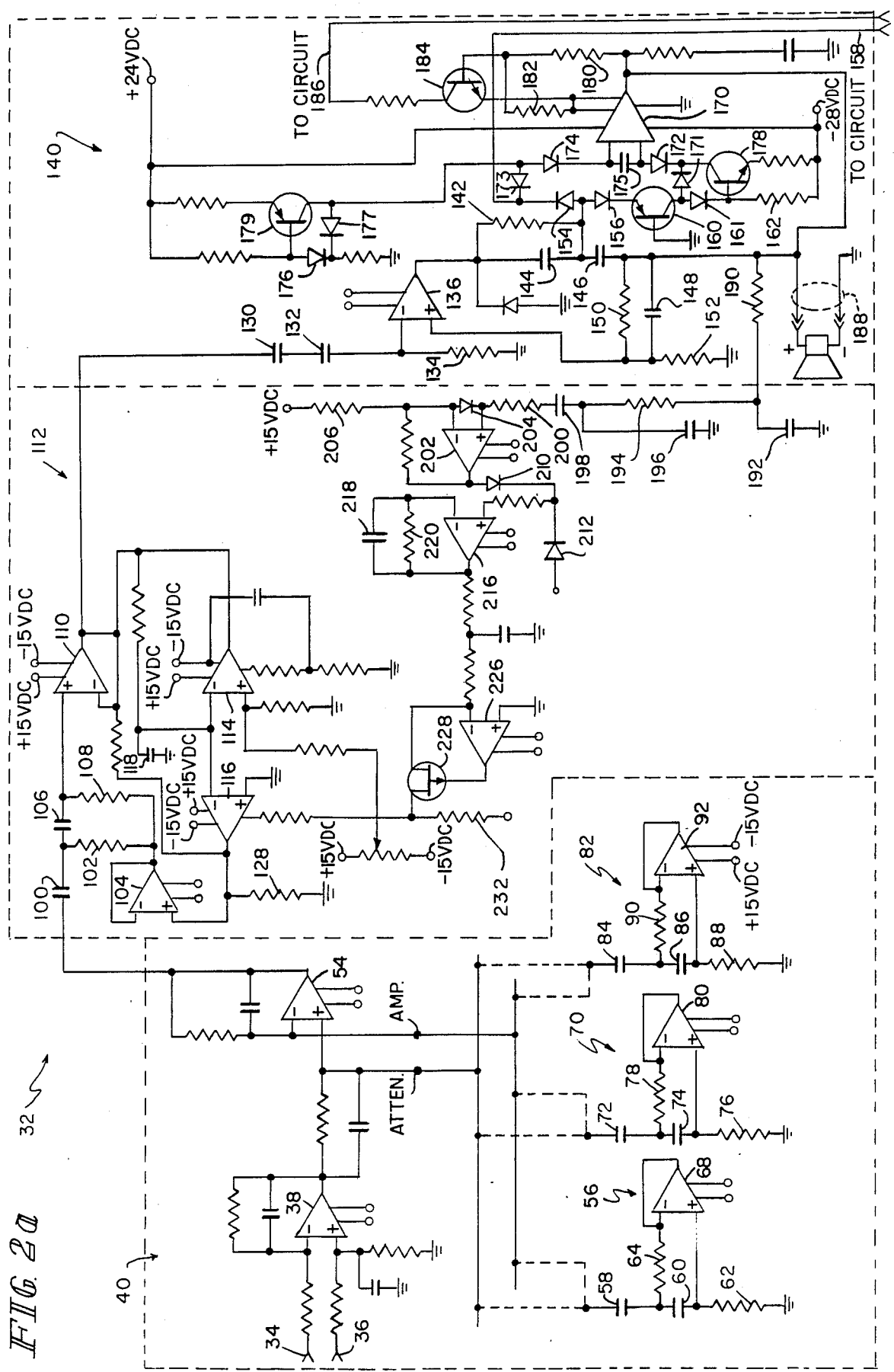
Figure 2B:
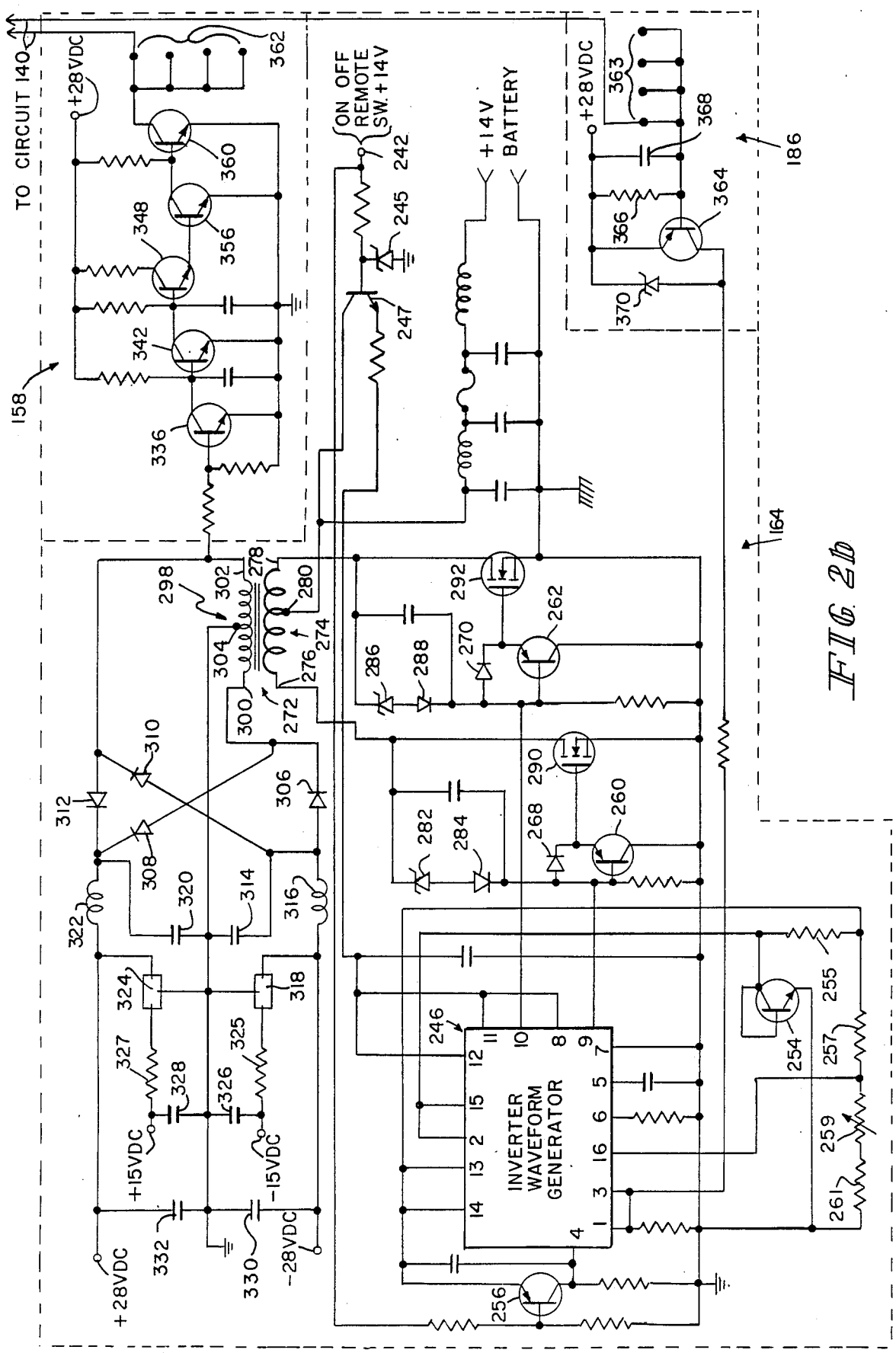

The invention may best be understood by referring to the following description and accompanying drawings which illustrate the invention. In the drawings:

FIG. 1 is a partly block and partly schematic diagram of an automotive sound system; and FIGS. 2a-b are a more highly detailed partly block and partly schematic diagram of a portion of the system illustrated in FIG. 1.

FIG. 1 illustrates a complete automotive sound system in block diagram form. The system "head end" comprises an electronically tunable radio (ETR) 20, such as the model E5VF-18B865-BA ETR available from Ford Motor Company. The two channel outputs 22, 24 of the ETR 20 provide signals to the right side (26) and left side (28) of a two-input channel to four-output channel amplifier 30. Amplifier 30 incorporates differential input and equalization, a bass contour control and a power amplifier for each of the four channels. In addition, the amplifier 30 incorporates an inverter for boosting the nominal +14 VDC automobile supply to ±28 VDC to operate the amplifier 30 circuitry. The amplifier 30 also incorporates on/off muting for all four channels and short circuit detection for all four channels. The four channels in the illustrative embodiment are right front (RF), left front (LF), right rear (RR) and left rear (LR). Different equalization and bass contouring are provided depending upon whether a channel is a front channel or rear channel. Different signals are, of course, supplied to right and left, thereby providing four output channels from the right and left input channels. In the discussion that follows, only a single output channel will be described, although it is to be understood that four such channels are provided. Where there are differences between front and rear channels, these differences will be noted. The inverter, on/off muting and short circuit detector circuits, which are common to all four channels, will also be discussed.

Turning now to FIG. 2a, a channel 32, illustratively RF, has signal input terminals 34, 36, which are coupled across the R output of the ETR 20. It is to be understood that the output signal from the ETR 20, whether R or L, may already have some equalization incorporated into it by signal processing within the ETR. Therefore, the signal processing which is achieved in the representative channel 32 is designed to use advantageously that prior equalization achieved within the ETR. However, even if no signal processing to perform equalization has been provided by the ETR, suitable equalization can be achieved within the channel 32.

In any event, signal is coupled from terminals 34, 36 through series 33K resistors to the non-inverting (+) and inverting (−) input terminals of a differential amplifier 38 in the differential input and equalization circuit 40 of channel 32. If the channel were a rear channel, the series resistors would be 22K resistors. The +input terminal of differential amplifier 38 is coupled to ground through a parallel RC combination including a 100 pF capacitor and 10K resistor. A similar parallel RC circuit including a 100 pF capacitor and a 10 K resistor is coupled between the −input terminal of differential amplifier 38 and the output terminal of differential amplifier 38. A parallel RC circuit including a 47 pF capacitor and a 5.1K resistor is coupled between the output terminal of differential amplifier 38 and the +input terminal of a differential amplifier 54. The −input terminal of differential amplifier 54 is coupled through a parallel RC circuit including a 47 pF capacitor and a 5.1K resistor to the output terminal of differential amplifier 54.

For convenience in adapting channel 32 to different vehicle interior characteristics which can dramatically affect the vehicle's interior sound characteristics, three different equalization gyrators are also provided on the board on which the differential input and equalization circuit 40 is mounted. The first of these gyrators, a gyrator 56, includes a series string of a capacitor 58, a capacitor 60 and a resistor 62, the other terminal of which is coupled to circuit ground. The junction of capacitor 58 and capacitor 60 is coupled through a series resistor 64 to the −input terminal of a differential amplifier 68. The junction of capacitor 60 and resistor 62 is coupled to the +input terminal of differential amplifier 68. The output terminal of differential amplifier 68 is coupled directly to its −input terminal.

The second gyrator 70 includes a series string of a capacitor 72, a capacitor 74 and a resistor 76, the other terminal of which is coupled to ground. The junction of capacitors 72, 74 is coupled through a series resistor 78 to the −input terminal of a differential amplifier 80. The junction of capacitor 74 and resistor 76 is coupled to the +input terminal of differential amplifier 80. The output terminal of differential amplifier 80 is coupled to its −input terminal.

A third gyrator 82 includes a series string of a capacitor 84, a capacitor 86 and a resistor 88, the other terminal of which is coupled to ground. The junction of capacitors 84, 86 is coupled through a series resistor 90 to the −input terminal of a differential amplifier 92 in gyrator 82. The junction of capacitor 86 and resistor 88 is coupled to the +input terminal of this differential amplifier 92. The output terminal of differential amplifier 92 is coupled to its −input terminal. The following table provides values for capacitors 58, 60, 72, 74, 84, 86 and resistors 62, 64, 76, 78, 88, and 90, for channel 32, whether channel 32 is a front channel or a rear channel.

TABLE I
GYRATOR R AND C VALUES FOR FRONT AND REAR CHANNELS

| Component | Front | Rear |
|---|---|---|
| 64 | 6190 ohms | 4990 ohms |
| 62 | 49.9K | 200K |
| 58 | .0033 uF | .01 uF |
| 60 | .0047 uF | .001 uF |
| 78 | 1620 ohms | 7870 ohms |
| 76 | 115K | 294K |
| 72 | .027 uF | .01 uF |
| 74 | .0047 uF | .001 uF |
| 90 | 6340 ohms | 1130 ohms |
| 88 | 88.7K | 301K |
| 84 | .033 uF | .22 uF |
| 86 | .015 uF | .0047 uF |

If attenuation is sought in connection with the equalization function of any one or more of gyrators 56, 70, 82, a jumper is coupled between the +input terminal of differential amplifier 54 and the input terminal 94, 96, 98 of that particular gyrator 56, 70 or 82, respectively. If amplification is sought in connection with the equalization function of any one or more of gyrators 56, 70 or 82, a jumper is connected between the −input terminal of differential amplifier 54 and the inPut terminal 94, 96 or 98 of that particular gyrator 56, 70 or 82, respectively. As used in the specification and claims, the term "equalization pole" is used to encompass both of these situations (attenuation and amplification).

The output terminal of differential amplifier 54 is coupled through a 0.1 µF capacitor 100 and a resistor 102 to the output terminal of a feedback amplifier 104. The common terminal of capacitor 100 and resistor 102 is coupled to one terminal of a 0.1 µF capacitor 106. The remaining terminal of capacitor 106 is coupled through a resistor 108 to the output terminal of amplifier 104. The values of resistors 102, 108 depend upon whether the channel 32 is a F channel or a R channel. For the illustrated F channel, the values of resistors 102, 108 are 5.1K. If the channel 32 were a R channel, the values of resistors 102, 108 would suitably be 10K.

The common terminal of capacitor 106 and resistor 108 is coupled to the +input terminal of a differential amplifier 110 which forms the input stage of the bass contour control circuit 112. The output terminal of differential amplifier 110 is coupled to its −input terminal, and through a 10K series resistor to the −input terminals of two differential amplifiers 114, 116. Amplifiers 114, 116 are transconductance amplifiers. The output terminal of differential amplifier 114 is coupled to its −input terminal, and to ground through a 680 pF capacitor 118. The +input terminal of differential amplifier 114 is coupled to ground through a 8.2 ohm resistor, and through a 15K resistor to the wiper of a distortion trimming 10K potentiometer, the terminals of which are coupled to ±15 VDC supplies.

The +input terminal of differential amplifier 116 is coupled to ground. The output terminal of differential amplifier 116 is coupled through a series 2K resistor to the −input terminal of differential amplifier 110. The output terminal of differential amplifier 116 is also coupled to ground through series peaking resistor 128. If the channel is a F channel, the value of resistor 128 is illustratively 47K. If the channel 32 is a R channel, the value of resistor 128 is illustratively 39K. The output terminal of differential amplifier 116 is also coupled to the +input terminal of amplifier 104.

The output terminal of differential amplifier 110 is coupled through a series string of a 22 µF capacitor 130, a 22 µF capacitor 132 and a 910 ohm resistor 134 to ground. The common terminal of capacitor 132 and resistor 134 is coupled to the −input terminal of a differential amplifier 136 which forms the input stage of the power amplifier 140 of channel 32. The output terminal of differential amplifier 136 is coupled through a parallel RC circuit including a 2.4 K resistor 142 and a 47 pF capacitor 144 to one terminal of a 47 pF capacitor 146. The remaining terminal of capacitor 146 is coupled through a parallel circuit including a 47 pF capacitor 148 and an 11K resistor 150 to the +input terminal of differential amplifier 136.

The +input terminal of differential amplifier 136 is also coupled to ground through a 1K resistor 152. The common terminal of resistor 142 and capacitors 144, 146 is coupled to the anodes of two diodes 154, 156. The cathode of diode 154 is coupled to the output terminal of the on/off muting circuit 158 (FIG. 2b). The cathode of diode 156 is coupled to the emitter of a transistor 160. The base of transistor 160 is coupled to ground and its collector is coupled to the anode of a diode 161, the cathode of which is coupled through a 220 ohm series resistor 162 to the −28 VDC supply provided by the inverter 164.

The anode of a diode 171 is also coupled to the collector of transistor 160. The cathode of diode 171 is coupled to the cathode of a diode 172, the anode of which is coupled to an input terminal, pin 7 of output stage 170. The cathode of diode 154 is coupled to the cathode of a diode 173, the anode of which is coupled to the anode of a diode 174. The cathode of diode 174 is coupled to an input terminal, pin 1 of output stage 170. A 0.1 µF capacitor 175 is coupled across pins 1, 7 of output stage 170.

+28 VDC is coupled to pin 2 of output stage 170. −28 VDC is coupled to pin 6 of output stage 170. +28 VDC is also coupled through a 1K resistor to the base of a transistor 179. The base of transistor 179 is coupled to the anode of a diode 176, the cathode of which is coupled through a 27K resistor to ground. The cathode of diode 176 is also coupled to the cathode of a diode 177, the anode of which is coupled to the anodes of diodes 173, 174 and the collector of transistor 179. The emitter of transistor 179 is coupled through an 82 ohm resistor to +28 VDC.

The cathodes of diodes 171, 172 are coupled to the collector of a transistor 178. The base of transistor 178 is coupled to the cathode of diode 161. The emitter of transistor 178 is coupled through a 10 ohm resistor to −28 VDC.

Components 154, 156, 160, 161, 162 and 171-179 and their associated circuits comprise the drive and bias offset networks for the input terminals, pins 1, 7 of output stage 170.

The output terminal, pin 4, of output stage 170 is coupled through series resistors 180, 182 of 220 ohms and 100 ohms resistance, respectively, to pins 3 and 5 of output stage 170. The output terminal of output stage 170 is also coupled through a series 2.7 ohm ½ watt resistor and a 0.1 µF capacitor to ground. The common terminal of resistors 180, 182 is coupled to the base of a transistor 184, the collector of which is coupled through a 10K series resistor to an input terminal of short circuit detector circuit 186 (FIG. 2b). The emitter of transistor 184 is coupled to pins 3 and 5 of output stage 170. The output terminal, pin 4, of output stage 170 is coupled to the common terminal of capacitors 146, 148 and resistor 150, to the +terminal of the speaker connector 188 for channel 32, and to an 11K resistor 190 of a series RC circuit which also includes a capacitor 192. The −terminal of speaker connector 188 is connected to ground.

If channel 32 is an F channel, the value of capacitor 192 illustratively is 0.15 µF. If channel 32 were a R channel, the value of capacitor 192 illustratively would be 0.22 µF. The common terminal of resistor 190 and capacitor 192 is coupled to one terminal of a 100K resistor 194. The other terminal of resistor 194 is coupled through a capacitor 196 to ground. If channel 32 is a F channel, the value of capacitor 196 is illustratively 0.033 µF. If channel 32 were a R channel, the value of capacitor 196 illustratively would be 0.047 µF.

The speaker drive signal from the output terminal of output stage 170 to speaker connector 188 is fed back through the network including resistor 190, capacitor 192, resistor 194, capacitor 196 and a series RC circuit including a 0.1 µF capacitor 198 and a 100K resistor 200 to the +input terminal of an amplifier 202. The cathode of a diode 204 is coupled to the +input terminal of amplifier 202. The anode of diode 204 is coupled to the −input terminal of amplifier 202, and through a threshold setting resistor 206 to the +15 VDC supply. Illustrative values for resistor 206 are 820K for the F channels and 1M for the R channels. A 100K feedback resistor is coupled between the output terminal of amplifier 202 and the −input terminal thereof. The anode of a diode 210 is coupled to the output terminal of amplifier 202. The cathode of diode 210 is coupled to the cathode of a diode 212. If diode 210 is in the RF channel, diode 212 is in the corresponding location in the LF channel. Therefore, the anode of diode 212 is coupled to the output terminal of an amplifier which occupies the same position in the LF channel as does amplifier 202 in the RF channel. Similarly, if diode 210 were in the RR channel, diode 212 would occupy the same position in the LR channel.

The cathodes of diodes 210, 212 are coupled through a 3.3K series resistor to the +input terminal of an amplifier 216. The output terminal of amplifier 216 is coupled through a parallel RC feedback circuit including a capacitor 218 and a resistor 220 to the −input terminal of amplifier 216. If the illustrated channel 32 is a F channel, the capacitance of capacitor 218 is illustratively 0.47 µF and the resistance of resistor 220 is illustratively 47K. If the illustrated channel 32 were a R channel, the capacitance of capacitor 218 illustratively would be 1.0 µF, and the resistance of resistor 220 illustratively would be 12K. A signal is coupled from the output terminal of amplifier 216 through a 2.4K resistor and a 22 µF capacitor to ground. The common terminal of this resistor and this capacitor is coupled through a series 2.4K resistor to the −input terminal of an amplifier 226 and to the drain terminal of an FET 228. The gate terminal of FET 228 is coupled to the output terminal of amplifier 226. The +input terminal of amplifier 226 is coupled to ground. The source terminal of FET 228 is coupled through a series 13K resistor to the gain control terminal, pin 16, of differential amplifier 116 in the bass contour control circuit 112. A corresponding 13K resistor 232 couples the source of FET 228 to the corresponding pin of an amplifier corresponding to amplifier 116 in the other F or R channel. For example, if the illustrated channel 32 is a RF channel, resistor 232 is coupled to the corresponding pin of an amplifier corresponding to amplifier 116 in the LF channel. Similarly, if channel 32 were a RR channel, resistor 232 would couple the source of FET 228 to pin 16 of an amplifier corresponding to amplifier 116 in the LR channel. It should be noted that amplifiers 216 and 226 and FET 228 and their associated passive components are not duplicated in the other F or R channel of the pair RF and LF or RR and LR. In other words RF and LF share a single circuit including amplifiers 216 and 226 and FET 228. Similarly, RR and LR share a single circuit including amplifiers 216 and 226 and FET 228. Referring to FIG. 2b, it is also to be understood that a single on/off muting circuit 158, a single inverter circuit 164 and a single short circuit detector circuit 186 are provided for all four channels RF, LF, RR, LR.

Turning now to the inverter circuit 164, a remote on/off switch (not shown) supplies nominal +14 VDC at a terminal 242. A 10K resistor and a Zener diode 245 are coupled in series between terminal 242 and ground. The cathode of Zener diode 245 is coupled to the base of transistor 247, the emitter of which is coupled through a 47 ohm resistor to a terminal, pin 12, of an inverter integrated circuit 246. Circuit 246 generates switching waveforms for the inverter circuit 164. The pin numbers illustrated in FIG. 2b are for a Texas Instruments type TL 594 inverter integrated circuit 246. However, it is to be understood that any other suitable inverter switching waveform generator could be used.

Pins 8, 11 of circuit 246 are coupled directly to pin 12. A 22 µF capacitor is coupled between pins 8, 1, 12 and pin 7 of circuit 246, the inverter common terminal. Pins 1, 3 of circuit 246 are joined and are coupled through a series 2.4K resistor to pin 7 of circuit 246. Pin 5 is coupled through a 0.0047 µF capacitor to pin 7. Pin 6 is coupled through a 2.4K resistor to pin 7. Pins 2 and 15 of circuit 246 are coupled to both the collector and base of a transistor 254. The emitter of transistor 254 is coupled to pin 7 of circuit 246. The collector and emitter of transistor 254 are coupled together by a series string of a 6.8K resistor 255, a 6.8K resistor 257, a 500 ohm potentiometer 259 and a 470 ohm resistor 261. The common terminal of resistors 255, 257 is coupled to terminals 13, 14 of circuit 246. The emitter of a transistor 256 is coupled to pins 13, 14 of circuit 246. Pins 13, 14 are also coupled through a series 22 µF capacitor to pin 4 of circuit 246. Pin 16 of circuit 246 is coupled to the common terminal of resistor 257 and potentiometer 259. The collector of transistor 256 is coupled to pin 4 of circuit 246, and through a 10K resistor to pin 7 of circuit 246. A resistive voltage divider comprising two 1K resistors is coupled between terminal 242 and pin 7 of circuit 246. The junction of these two 1K resistors is coupled to the base of transistor 256.

The output terminals, pins 9, 10 of circuit 246 are coupled, respectively, to the bases of transistors 260, 262. The bases of transistor 260, 262 are coupled through series 1K resistors to pin 7 of circuit 246. The collectors of transistors 260, 262 are coupled to pin 7. The emitters of transistors 260, 262 are coupled to the cathodes of diodes 268, 270, respectively, the anodes of which are coupled to the bases of transistors 260, 262, respectively.

An inverter transformer 272 includes a primary winding 274 having end terminals 276, 278 and a center tap 280. End terminal 276 is coupled to the cathode of a Zener diode 282, the anode of which is coupled to the anode of a diode 284. A 47 pF capacitor is coupled between the cathodes of diodes 282, 284. The cathode of diode 284 is coupled to pin 9 of circuit 246. End terminal 278 is coupled to the cathode of a Zener diode 286, the anode of which is coupled to the anode of a diode 288. A 47 pF capacitor is coupled between the cathodes of diodes 286, 288. The cathode of diode 288 is coupled to pin 10 of circuit 246. The emitter of transistor 260 is coupled to the gate electrodes of three FETs 290 whose source and drain terminals are connected in parallel. For purposes of simplifying the circuit diagram, only one of these FETs 290 is illustrated. The sources of all of these FETs 290 are coupled to pin 7 of circuit 246. The drains of all of FETs 290 are coupled to end terminal 276. The emitter of transistor 262 is coupled to the gate electrodes of three FETs 292 whose source and drain terminals are connected in parallel. Again, for purposes of simplifying the circuit diagram, only one of these FETs 292 is illustrated. The sources of FETs 292 are coupled to pin 7 of circuit 246. The drains of FETs 292 are coupled to end terminal 278. Center tap 280 of primary 274 is coupled through two parallel 470 $\mu$F, 25 V capacitors to chassis ground. In order to simplify the circuit diagram, only one of these 470 $\mu$F capacitors is illustrated. Pin 7 is coupled to the chassis ground. The center tap 280 of primary winding 274 is also coupled through a 3 $\mu$H choke and 470 $\mu$F capacitor to ground. The common terminal of the 3 $\mu$H choke and 470 $\mu$F capacitor is coupled through a 20 ampere fuse 296 and a 10,000 $\mu$F capacitor to ground. The common terminal of the fuse 296 and the 10,000 $\mu$F capacitor is coupled through a 1.2 mH choke to nominal +14 VDC.

The secondary winding 298 of inverter transformer 272 includes end terminals 300, 302 and a center tap 304. The center tap 304 is coupled to ground. The cathode of a diode 306 and the anode of a diode 308 are coupled to end terminal 300. The cathode of a diode 310 and the anode of a diode 312 are coupled to end terminal 302. The anodes of diodes 306, 310 are joined, as are the cathodes of diodes 308, 312. Diodes 306, 308, 310, 312 thus form a full-wave bridge rectifier for the voltage variations appearing across secondary winding 298. The anodes of diodes 306, 310 are coupled through a 470 $\mu$F, 35V capacitor 314 to ground, and through a 3 $\mu$H choke 316 to an input terminal of a 15 VDC regulator 318. The cathodes of diodes 308, 312 are coupled through a 470 $\mu$F, 35V capacitor 320 to ground, and through a 3 $\mu$H choke 322 to an input terminal of a 15 VDC regulator 324. The common terminals of regulators 318, 324 are coupled to ground. The output terminals of regulators 318, 324 are coupled through respective 10 ohm resistors 325 and 327 and 22 $\mu$F capacitors 326, 328 in series to ground. $-15$ VDC is available across capacitor 326. $+15$ VDC is available across capacitor 327.

Two 220 $\mu$F capacitors in parallel are coupled between the input terminal of regulator 318 and ground. Only one of these capacitors, capacitor 330, is illustrated in the circuit diagram for purposes of simplification. $-28$ VDC is available at the ungrounded terminal of capacitor 330. Two parallel 220 $\mu$F capacitors are coupled between the input terminal of regulator 324 and ground. Again, only one of these capacitors, capacitor 332, is illustrated for purposes of simplification. $+28$ VDC is available at the ungrounded terminal of capacitor 332. The drive signals available at pins 9, 10 of circuit 246 are amplified by transistors 260, 262, respectively, and drive the 3 parallel FETs represented by each of FETs 290, 292. The switching of end terminals 276, 278 to ground which results from these driving signals causes voltage variations to appear across secondary winding 298. These voltage variations are rectified in the full-wave bridge 306, 308, 310, 312 and filtered by the respective filters 314, 316 and 320, 322 to provide the operating voltages for the illustrated circuits.

The on/off muting circuit 158 of FIG. 2 includes a transistor 336, the base of which is coupled through a 100K series resistor to end terminal 302 of secondary 298. The base of transistor 336 is also coupled through a 10K resistor to ground. The emitter of transistor 336 is coupled to ground. The collector of transistor 336 is coupled to the base of a transistor 342, through a 47K series resistor to +28 VDC, and through a 0.01 $\mu$F capacitor to ground. The emitter of transistor 342 is coupled to ground. Its collector is coupled to the base of a transistor 348, through a 1.5M resistor to +28 VDC and through a 22 $\mu$F capacitor to ground. The collector of transistor 348 is coupled through a 10K resistor to +28 VDC. Its emitter is coupled to the base of a transistor 356. The collector of transistor 356 is coupled to the base of an on/off muting circuit output transistor 360, and through a 10K series resistor to +28 VDC. The emitters of both of transistors 356, 360 are coupled to ground. The collector of transistor 360 forms the muting circuit 158 output terminal 362. The muting signal is derived from end terminal 302 of secondary winding 298 in the inverter circuit 240. This signal drives, through the various stages 336, 342, 348, 356, 360 the muting output terminal 362. The power amplifiers 140 of all four (RF, RR, LF, LR) channels 32 are coupled to muting circuit output terminal 362.

Similarly, the power amplifiers 140 of all four channels are coupled to the short circuit detector circuit 186 input terminal 363. Input terminal 363 of short circuit detector circuit 186 is coupled to the base of a transistor 364. The emitter of transistor 364 is coupled through a parallel RC circuit including a 1K resistor 366 and a 0.1 $\mu$F capacitor 368 to its base. The emitter of transistor 364 is also coupled to +28 VDC supply. The cathode of a Zener diode 370 is coupled to the emitter of transistor 364. The anode of Zener diode 370 is coupled to the collector of transistor 364. The collector of transistor 364 is coupled through a series 10K resistor to pins 1, 3 of the inverter drive signal generator integrated circuit 246. If a short circuit appears across any of the power amplifier 140 speaker connector 188 terminals, transistor 184 in the channel's power amplifier 140 is turned off, resulting in turning of transistor 364 off. This results in a low voltage condition at pins 1, 3 of the inverter drive signal generator integrated circuit 246. This removes drive signal from pins 9, 10 of circuit 246, which results in fairly rapid decay of the +28 VDC, +15 VDC, $-15$ VDC and $-28$ VDC supplies.

The following is a table of the active components of the circuit of FIG. 2 with illustrative types and sources.

TABLE II

| Active Component | Type and Source |
|---|---|
| 38 | ½ LF353 National Semiconductor |
| 54 | ¼ LF347 National Semiconductor |
| 68 | ¼ LF347 National Semiconductor |
| 80 | ¼ LF347 National Semiconductor |
| 92 | ¼ LF347 National Semiconductor |
| 104 | ¼ LF347 National Semiconductor |
| 110 | ¼ LF347 National Semiconductor |

TABLE II-continued

| Active Component | Type and Source |
|---|---|
| 114 | ¼ LM13600 National Semiconductor |
| 116 | ¼ LM13600 National Semiconductor |
| 136 | ½ 5532 Signetics |
| 154 | 1N4148 |
| 156 | 1N4148 |
| 160 | 2N3906 Motorola |
| 161 | 1N4148 |
| 170 | ½ STK2240 Sanyo |
| 171 | 1N4148 |
| 172 | 1N4148 |
| 173 | 1N4148 |
| 174 | 1N4148 |
| 176 | 1N4148 |
| 177 | IN4148 |
| 178 | MPS8099 Motorola |
| 179 | MPS8599 Motorola |
| 184 | MPS8099 Motorola |
| 202 | ¼ LM3900 National Semiconductor |
| 204 | 1N4148 |
| 210 | 1N4148 |
| 212 | 1N4148 |
| 216 | ¼ LM3900 National Semiconductor |
| 226 | ¼ LM3900 National Semiconductor |
| 228 | 2N4360 Motorola |
| 245 | 1N4112 |
| 246 | TL594 Texas Instruments |
| 247 |  |
| 254 | TIP31C |
| 256 | 2N4403 Motorola |
| 260 | 2N4403 Motorola |
| 262 | 2N4403 Motorola |
| 268 | 1N4148 |
| 270 | 1N4148 |
| 282 | 1N5259 |
| 284 | 1N4148 |
| 286 | 1N5259 |
| 288 | 1N4148 |
| 290 | 3 BUZ71A Seimens/International Rectifier |
| 292 | 3 BUZ71A Seimens/International Rectifier |
| 306 | ½ TG284A Varo |
| 308 | ½ TG284 Varo |
| 310 | ½ TG284A Varo |
| 312 | ½ TG284 Varo |
| 318 | 7915 Motorola |
| 324 | 7815 Motorola |
| 336 | 2N3904 Motorola |
| 342 | 2N3904 Motorola |
| 348 | 2N3904 Motorola |
| 356 | 2N3904 Motorola |
| 360 | 2N3904 Motorola |
| 364 | 2N4403 Motorola |
| 370 | 1N5259 |

What is claimed is:

1. A sound system comprising at least one channel, each such channel having a low level input for coupling to a source of program material, multiple, independently selectable means providing equalization poles, means including an input stage independently and selectively coupling one or more of the multiple equalization pole-providing means to the low level input, an amplifier, means for coupling the selected one or more of the multiple equalization pole-providing means to the amplifier, a transducer, and means for coupling the transducer to the amplifier, the means for coupling the selected one or more of the multiple equalization pole-providing means to the amplifier comprising a filter having a variable lower corner frequency and a control input terminal, the system further comprising a low-pass filter circuit for generating a feedback signal, means for coupling the low-pass filter circuit to the amplifier, and means for coupling the low-pass filter circuit to the control input terminal of the variable corner frequency filter.

2. The sound system of claim 1 wherein there are four such channels divided into two pairs and the low-pass filter circuits in one pair of such channels have higher corner frequencies than the low-pass filter circuits in the other pair of such channels.

3. The sound system of claim 2 wherein the sound system is an automotive sound system and the two pairs of channels comprise a pair of front channels and a pair of rear channels and the low-pass filter circuits in the rear channels have relatively lower corner frequencies than the low-pass filter circuits in the front channels.

4. A sound system comprising at least one channel, each such channel having a low level input for coupling to a source of program material, multiple, independently selectable means providing equalization poles, means for independently and selectively coupling one or more of the multiple equalization pole-providing means to the low level input, an amplifier, means comprising a filter having a variable lower corner frequency and a control input terminal for coupling the selected one or more of the multiple equalization pole-providing means to the amplifier, a transducer, means for coupling the transducer to the amplifier, a low-pass filter circuit for generating a feedback signal, means for coupling the low-pass filter circuit to the amplifier, and means for coupling the low-pass filter circuit to the control input terminal of the variable corner frequency filter.

5. The sound system of claim 4 wherein there are four such channels divided into two pairs and the low-pass filter circuits in one pair of such channels have higher corner frequencies than the low-pass filter circuits in the other pair of such channels.

6. The sound system of claim 5 wherein the sound system is an automotive sound system and the two pairs of channels comprise a pair of front channels and a pair of rear channels and the low-pass filter circuits in the rear channels have relatively lower corner frequencies than the low-pass filter circuits in the front channels.

7. A sound system comprising at least two channels, each including means for coupling a source of program material to the channel, an input stage, a second stage, multiple, independently selectable means providing equalization poles, means for independently and selectively coupling one or more of the multiple equalization pole-providing means to the input stage and to the second stage, a filter having a variable lower corner frequency and a control input terminal, means for coupling the second stage to the variable corner frequency filter, an amplifier, means for coupling the variable corner frequency filter to the amplifier, a transducer, means for coupling the transducer to the amplifier, a low-pass filter circuit for generating a feedback signal, means for coupling the low-pass filter circuit to the amplifier, and means for coupling the low-pass filter circuit to the control input terminal of the variable corner frequency filter, the low-pass filter circuit controlling the variable lower corner frequency.

8. The apparatus of claim 7 wherein there are four such channels divided into two pairs and the low-pass filter circuit in one pair of such channels have higher corner frequencies than the low-pass filter circuits in the other pair of such channels.

9. The apparatus of claim 8 wherein the sound system is an automotive sound system and the two pairs of channels comprise a pair of front channels and a pair of rear channels and the low-pass filter circuits in the rear channels have relatively lower corner frequencies than the low-pass filter circuits in the front channels.

* * * * *

UNITED STATES PATENT AND TRADEMARK OFFICE
CERTIFICATE OF CORRECTION

PATENT NO. : 4,759,065
DATED : JULY 19, 1988
INVENTOR(S) : Daniel J. Field and Richard C. Field It is certified that error appears in the above-identified patent and that said Letters Patent is hereby corrected as shown below:

On the bibliography page at [56] References Cited U.S. PATENT DOCUMENTS, please delete "3,134,059" and insert therefor --2,134,059--;

At column 7, line 27, please delete "inPut" and insert therefor --input--;

At column 10, line 31, please delete "1" and insert therefor --11--;

At column 11, line 46, please delete "30B" and insert therefor --308--;

At column 13, line 53, after the word "stage" please insert --for--;

At column 14, line 57, please delete "whrein" and insert therefor --wherein--; and At column 14, line 59, please delete "circuit" and insert therefor --circuits--.

Signed and Sealed this

Third Day of January, 1989

Attest:

DONALD J. QUIGG

*Attesting Officer*  *Commissioner of Patents and Trademarks*